US 8,004,317 B2

(12) United States Patent
Palmer et al.

(10) Patent No.: US 8,004,317 B2
(45) Date of Patent: Aug. 23, 2011

(54) CONTROLLING COMMUTATION OF A POWER SEMICONDUCTOR SWITCHING DEVICE AND FREEWHEEL DIODE PAIR

(75) Inventors: Patrick Reginald Palmer, Cambridge (GB); Yalan Wang, Cambridge (GB); Angus Toby Bryant, Warwick (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 12/441,128

(22) PCT Filed: Sep. 10, 2007

(86) PCT No.: PCT/GB2007/050531
§ 371 (c)(1),
(2), (4) Date: Sep. 29, 2009

(87) PCT Pub. No.: WO2008/032113
PCT Pub. Date: Mar. 20, 2008

(65) Prior Publication Data
US 2010/0060326 A1    Mar. 11, 2010

(30) Foreign Application Priority Data
Sep. 13, 2006    (GB) .................................. 0617990.7

(51) Int. Cl.
*H03K 3/00* (2006.01)
(52) U.S. Cl. ........ 327/108; 327/112; 327/423; 323/276; 323/277
(58) Field of Classification Search .................. 323/276, 323/277; 327/108, 112, 423
See application file for complete search history.

(56) References Cited

U.S. PATENT DOCUMENTS

| | | | |
|---|---|---|---|
| 4,661,766 A | * | 4/1987 | Hoffman et al. .............. 323/287 |
| 4,967,309 A | * | 10/1990 | Hoffman ....................... 361/160 |
| 5,055,721 A | * | 10/1991 | Majumdar et al. ............ 327/434 |
| 5,390,070 A | * | 2/1995 | Niedermeier ................. 361/152 |

(Continued)

FOREIGN PATENT DOCUMENTS
DE    3730503    3/1989
(Continued)

OTHER PUBLICATIONS

International Search Report and Written Opinion of the International Search Authority from PCT patent application PCT/GB2007/050531 (10 pages).

(Continued)

*Primary Examiner* — Kenneth B. Wells
(74) *Attorney, Agent, or Firm* — Clise, Billion & Cyr, P.A.; Timothy Clise

(57) ABSTRACT

This invention relates to a control method and a circuit for MOS-gated power semiconductor switching devices such as IGBTs or MOSFETs, which allows control and optimisition of the current and voltage commutation of a power semiconductor switching device and freewheel diode pair in the basic half-bridge circuit found in a wide range of equipment. The method comprises the stages of: applying, upon receipt of a switch-on command signal, a voltage function to the control terminal or the gate of the power semiconductor switching device that allows a regulated current rise in the device whilst maintaining the voltage across the device falling at a predetermined rate; and at the instant when the voltage across the diode begins to change from the on-state towards the off-state level, applying a voltage function to the control terminal or the gate of the power semiconductor switching device to enable the voltage falling across the power semiconductor switching device to track the voltage falling across the diode in order to ensure a fast and controlled completion of the switching operation without diode reverse voltage overshoot. The gate drive automatically modifies the voltage function according to the working condition thereby accounting for the actual operating conditions.

20 Claims, 6 Drawing Sheets

U.S. PATENT DOCUMENTS

| | | | |
|---|---|---|---|
| 5,912,552 A * | 6/1999 | Tateishi | 323/285 |
| 6,366,066 B1 * | 4/2002 | Wilcox | 323/282 |
| 7,701,738 B2 * | 4/2010 | Pruessmeier et al. | 363/132 |
| 2004/0169975 A1 | 9/2004 | Muenzer et al. | 361/91.1 |
| 2005/0253165 A1 | 11/2005 | Pace et al. | 257/139 |

FOREIGN PATENT DOCUMENTS

| | | |
|---|---|---|
| EP | 0508171 | 10/1992 |
| WO | WO9743832 | 11/1997 |
| WO | WO2004008601 | 1/2004 |

OTHER PUBLICATIONS

EP0508171, Oct. 14, 1992, Siemens, English Abstract.

International Preliminary Report on Patentability from the International Bureau for PCT patent application PCT/GB2007/050531 (6 pages).

* cited by examiner

CONTROLLING COMMUTATION OF A POWER SEMICONDUCTOR SWITCHING DEVICE AND FREEWHEEL DIODE PAIR

The present application is a nationalization of PCTPCT/GB2007/050531, filed 10 Sep. 2007, published as WO 2008/032113, which claims priority to UK application no. 0617990.7, filed 13 Sep. 2006, which are all incorporated by reference herein for any purpose.

FIELD OF THE INVENTION

This invention generally relates to the control of power semiconductor devices, and in embodiments particularly relates to the concurrent control of power semiconductor switching devices and freewheel diodes.

BACKGROUND TO THE INVENTION

Power semiconductor devices are widely in use for a large range of power applications, from low voltage chips, computers, locomotives, to high voltage transmission lines. In most circuits, freewheel diodes need to be used in relation with the power semiconductor switching devices such as IGBTs (insulated gate bipolar transistors) or MOSFETs (metal oxide semiconductor field effect transistors) for a continuous load current conduction to avoid large voltage damaging the semiconductor devices and the circuit. High power IGBTs are often supplied as a module with diodes that act as freewheel diodes within the module. IGBTs are typically found in parallel with the diodes. Reliable switching operation of both a power semiconductor switching device and a freewheel diode is of primary importance. Optimisation of the operation is also necessary to obtain high efficiency and low power dissipation of the whole circuit. In order to achieve these aims, one main concern is the current commutation from a freewheel diode to a power semiconductor switching device during the switch-on operation of the main switching device. Excessive diode voltage overshoot and power dissipation associated with the diode reverse recovery resulting from a poor commutation will impose high stresses on both the devices, limiting their application range. In particular, when there is a lack of good control, high power diodes may suffer from punch-through and a resulting snappy recovery with a sudden and large reverse voltage increase accompanied by high-frequency oscillation.

Attempts have been made to control IGBTs and other power semiconductor switching devices by use of feedback control techniques including voltage, dv/dt, current and di/dt feedback control. Open loop networks are also widely employed. However, the freewheel diode cannot be directly controlled. Some lower power circuits even dispense with the diodes and use controlled switching devices in place of them. As a result, while those methods or gate drives embody some of the techniques described above, they fail to properly address the concurrent control of both the power semiconductor switching device and the conventional freewheel diode. They are frequently tailor-made to the application, where the user has to ensure that the commutation results in transient voltages and currents within bounds. Good control is difficult to achieve in many applications as the conditions such as load currents and temperatures are continuously changing. Even using feedback control, the result is highly empirical, and the need to adjust the gate drive for different operating conditions can make conventional methods very undesirable and inefficient.

Background prior art can be found in WO 9743832 and US 2005253165.

SUMMARY OF THE INVENTION

According to a first aspect of the invention there is provided a method of controlling the commutation of a power semiconductor switching device and freewheel diode pair, the method comprising the stages of: applying, upon receipt of a switch-on command signal, a voltage function to a control terminal or the gate of the power semiconductor switching device, said voltage function allowing regulation of a current rise in the device whilst changing the voltage across the device; and substantially at the instant when the voltage across the diode ($V_{AK}$) begins to change from an on-state towards an off-state voltage, applying a voltage function to the control terminal or the gate of the power semiconductor switching device to enable the voltage change across the power semiconductor switching device to substantially track the voltage change across the diode.

The voltage function, that is the voltage shape or waveform, is in embodiments chosen to control the rate of change of the current and may comprise, a (slow) ramp or a (small) step, for example of around 10 percent of the total change. By changing the switching device voltage in this way the current through the diode changes gradually (by contrast with a large step change in control voltage). In embodiments parasitic or other inductance in the circuit, more particularly in the series connected switching device and diode, results in a gradual change of current. In embodiments where voltage feedback is employed to control the switching an approximately linear ramp of current may be achieved.

Broadly speaking in embodiments the concept is to change the voltage on the control terminal or gate of the active switching device using an initial ramp or step to determine when the passive switching device (diode) begins to switch. At this point the switching of the diode can be controlled by the active switch, thus enabling the switching of the active (IGBT) and passive (diode) switches to be synchronised. Thus embodiments of the method involve watching the diode to determine when it begins to switch; this point can be identified by identifying when the voltage across the diode begins to fall towards or through zero. One can define a sign convention such that when the diode is on the diode voltage is called positive and when the voltage begins to fall below zero and becomes negative the diode turns off—that is when the voltage across the diode reverses. The skilled person will appreciate, however, that the voltages across the active and passive switching devices operate as a see-saw, so that as one rises the other falls, and vice versa.

In embodiments changing the voltage across the power semiconductor switching device comprises maintaining a falling voltage, at a pre-determined rate, across the device. However alternatively changing the voltage across this device may comprise maintaining the voltage to follow a predetermined waveform which may be stepped or linear (or piecewise linear) or both.

In embodiments the method comprises synchronising the start of a voltage appearing across the freewheel diode (when the voltage across the diode begins to fall towards or through zero) with the main voltage fall of the power semiconductor switching device (that is when the diode begins switching) and a current peak in the power semiconductor switching device. In this way a safe and efficient current commutation substantially without diode reverse overshoot may be achieved. We illustrate later in reference to FIG. 4 when the diode voltage ($V_{AK}$) begins to switch (point $T_3$ and dashed line to corner 53) but it can be seen in this figure that this point is not precisely coincident with the peak in diode current $I_C$. The peak in $I_C$ is where the rate of change of current changes from positive to negative and thus is a conveniently identifiable feature on the diode current waveform. However it can be seen that this is not precisely coincident with the switching point of the diode although it is substantially at this instant (in embodiments we are slightly late).

In embodiments of the method the voltage function used to control the rate of voltage decrease across the power semiconductor switching device is determined by closed loop feedback monitoring. In embodiments the voltage function for controlling the power semiconductor switching device to track the diode voltage falling can be altered to ensure an optimum commutation process. That is in embodiments the voltage function (waveform) may be controlled to control the commutation process.

In another aspect the invention provides a circuit for implementing a method as described above, the circuit comprising: a gate drive circuit for providing a gate drive voltage for the power semiconductor switching device, and a control signal generating circuit, connected to the gate drive circuit, wherein upon receipt of a switch-on signal a first stage control signal is produced to control the gate drive circuit to drive the power semiconductor switching device to change said voltage across said device and a second stage control signal is generated, synchronised with the start of said voltage across said diode falling, to control the gate drive circuit to drive the voltage across the power semiconductor switching device to change substantially in synchronism with the diode voltage.

As described above, in embodiments the voltages across the diode and across the power semiconductor switching device operate as a see-saw, that is the changes in voltage across these device substantially track one another. (If absolute voltage polarities are employed this may be expressed as both voltages falling at substantially the same rate).

In embodiments the control signal generating circuit comprises a closed loop voltage feedback circuit to feedback a sensed voltage from the power semiconductor switching device and freewheel diode pair to the control signal generating circuit, and a current monitoring circuit to feedback a current sense signal from the device and diode pair to the control signal generating circuit. In embodiments both the first and second stage control signals are responsive to the sensed voltage and sensed current signal. In embodiments the sensed current signal senses a rate of change of the current through the device and diode pair.

In a further related aspect the invention provides a circuit for controlling the commutation of a power semiconductor switching device and freewheel diode pair, the circuit comprising: means for applying, upon receipt of a switch-on command signal a voltage function to a control terminal or the gate of the power semiconductor switching device, a current rise in the device whilst changing the voltage across the diode; and means for, substantially at the instant when the voltage across the diode begins to change from an on-state towards an off-state voltage, applying a voltage function to the control terminal or the gate of the power semiconductor switching device to enable the voltage change across the power semiconductor switching device to substantially track the voltage change across the diode.

In a still further related aspect the invention provides a commutation control circuit for a chopper, said chopper comprising an active switching device and a passive switching device coupled in series, said commutation control circuit being configured to control commutation of said switching devices such that said switching devices switch substantially in synchronism, said control circuit comprising; a first sense input to receive a first sense signal from said chopper circuit; a second sense input to receive a second sense signal from said chopper circuit; and a control signal generating circuit coupled to said first and second sense inputs and having an output to control switching of said active switching device; and wherein said control signal generating circuit is configured to use said first and second sense signals to determine when said passive switch begins to switch and to control said active switching device such that said active and passive switching devices switch substantially in synchronism.

In some preferred embodiments the commutation control circuit identifies a feature in a current sense signal sensing a current through the passive switching device, for example the polarity change of the rate change of diode current (or, in more accurately synchronised embodiments, the zero crossing of the diode voltage), to determine when the passive switch begins to switch. In embodiments the other sense signal comprises a voltage sense signal. In principle two voltage sense signals could be employed but this is less preferable because it is likely that for many applications one of the sensed voltages would be a relatively high voltage.

In embodiments the control signal generating circuit comprises at least one digital control loop. For example a rate of change of current may be sensed and used to generate a (1 bit) timing control signal when the di/dt changes from positive to negative (or vice versa). This may be used to identify, approximately, a corner in the diode voltage, identifying a point at which the diode commences to switch. The control signal generating circuit may then generate a control signal to change the voltage on the active switch, for example the collector or emitter voltage of an IGBT, to bring this voltage down rapidly. In embodiments this may be performed by using digital circuitry to control a digital-to-analogue converter in response to the timing control signal. This function may be performed, for example, by high speed digital circuitry and implemented in an FPGA (field programmable gate array). Often switching times are of order nanoseconds and such an arrangement facilitates control on this timescale. Such arrangements facilitate control of the switching active and passive devices in synchronism.

We will therefore describe a control method and a circuit for dynamically regulating switching operation of power semiconductor switching devices such as IGBTs or power MOSFETs, which addresses the aforementioned problems and allows control and optimisation of the commutation of a power semiconductor switching device and freewheel diode pair for a wide range of possible operating conditions.

In embodiments the method comprises the stages of: applying, upon receipt of a switch-on command signal, a voltage function to the control terminal or the gate of the power semiconductor switching device that allows a regulated current rise in the device whilst maintaining the voltage across the device falling at a predetermined rate; and at substantially the instant when the voltage across the diode begins to change from the on-state towards the off-state level, applying a voltage function to the control terminal or the gate of the power semiconductor switching device to enable the voltage falling across the power semiconductor switching device to track the voltage falling across the diode in order to ensure a fast and controlled completion of the switching operation without diode reverse voltage overshoot.

Said instant is determined by specific real-time device conditions instead of being preset. The gate drive automatically modifies the voltage function according to the working condition thereby accounting for the actual operating conditions. The particular relationship between the power switching device voltage and the diode voltage makes the method feature a so-called tracking control.

By means of synchronising the start of the voltage appearing across the freewheel diode with the main voltage fall of the power semiconductor switching device during the switch-on process, the method is able to avoid the reverse recovery voltage overshoot of the freewheel diode and the high current spike of the power semiconductor switching device. It can therefore achieve a safe and efficient current and voltage commutation between the power semiconductor switching device and the freewheel diode with optimised switching losses and switching stresses below desired limits Said two-stage voltage function applied to the gate of the power semiconductor switching device can be altered to ensure that the optimum switch-on characteristics are achieved for the particular switching device and diode being used and the conditions. Multiple loop feedback and monitoring of several variables such as current and voltage may be incorporated to produce said two-stage voltage function. The various techniques found in control theory may also be applied here with cascade control of the gate voltage as well as the power semiconductor switching device voltage, adaptive control of the features of said two-stage voltage function and so forth.

In addition, the method is able to permit the regulation of the current rise rate of the power semiconductor switching device during its switch-on operation by circumscribing the voltage fall across the switching device in most conventional circuits which include stray inductance.

Consequently, the method achieves a reliable control of the inherently non-linear transient behaviours of a power semiconductor switching devices and a freewheel diode, and optimises the performance of both devices in their SOAs (safe operating areas).

Because of the controlled switching of both the power semiconductor switching device and the freewheel diode, embodiments of the present invention are also a good solution to serial device operation for high power applications, wherein series connection of power semiconductor switching devices such as IGBTs offers an alternative to high voltage thyristors. While IGBTs connected in series are each controlled in accordance with the present method, the switch-on behaviour of individual switch device can be synchronised and the interaction with diodes can be under control. Hence, traditional bulky and expensive switch-on snubber circuit for series connection can be avoided.

We also describe a circuit for implementing a method as described above. In embodiments the circuit comprises: a gate drive circuit for providing the gate drive voltage to the control terminal or the gate of the power semiconductor switching device; and a control signal generating circuit, connected to the gate drive circuit, wherein, upon receipt of a switch-on signal, a first stage of control signal is produced to control the gate drive circuit to drive the power semiconductor switching device voltage to fall at a predetermined rate, and at substantially the instant when the diode voltage starts to change from the on-state towards the off-state level a second stage of control signal is generated to control the gate drive circuit to drive the power semiconductor switching device voltage to fall at the same or other rate to the diode voltage falling and to rapidly switch on the power semiconductor switching device.

The control signal generating circuit may incorporate closed-loop circuits and voltage or current monitoring circuits.

Preferably said instant for the circuit is determined by the change of the diode voltage, but it may instead be generated according to other variables. A simple self-timing method to create the two distinctive stages in said control signal is proposed in the following embodiment. In this the switching device current is monitored and the second stage of the switch-on is delayed until the current in the switching device changes the polarity of its rise rate. In embodiments this approach has the advantage of using feedback loops, making control circuit self-contained and compact.

The skilled person will appreciate that various circuit approaches may be used for implementing the present method.

BRIEF DESCRIPTION OF THE DRAWINGS

Preferred embodiments of the invention will now be described with reference to the accompanying drawings in which.

DETAILED DESCRIPTION OF PREFERRED EMBODIMENTS

Practical details will now be described with reference to the accompanying drawings.

Figure 1:
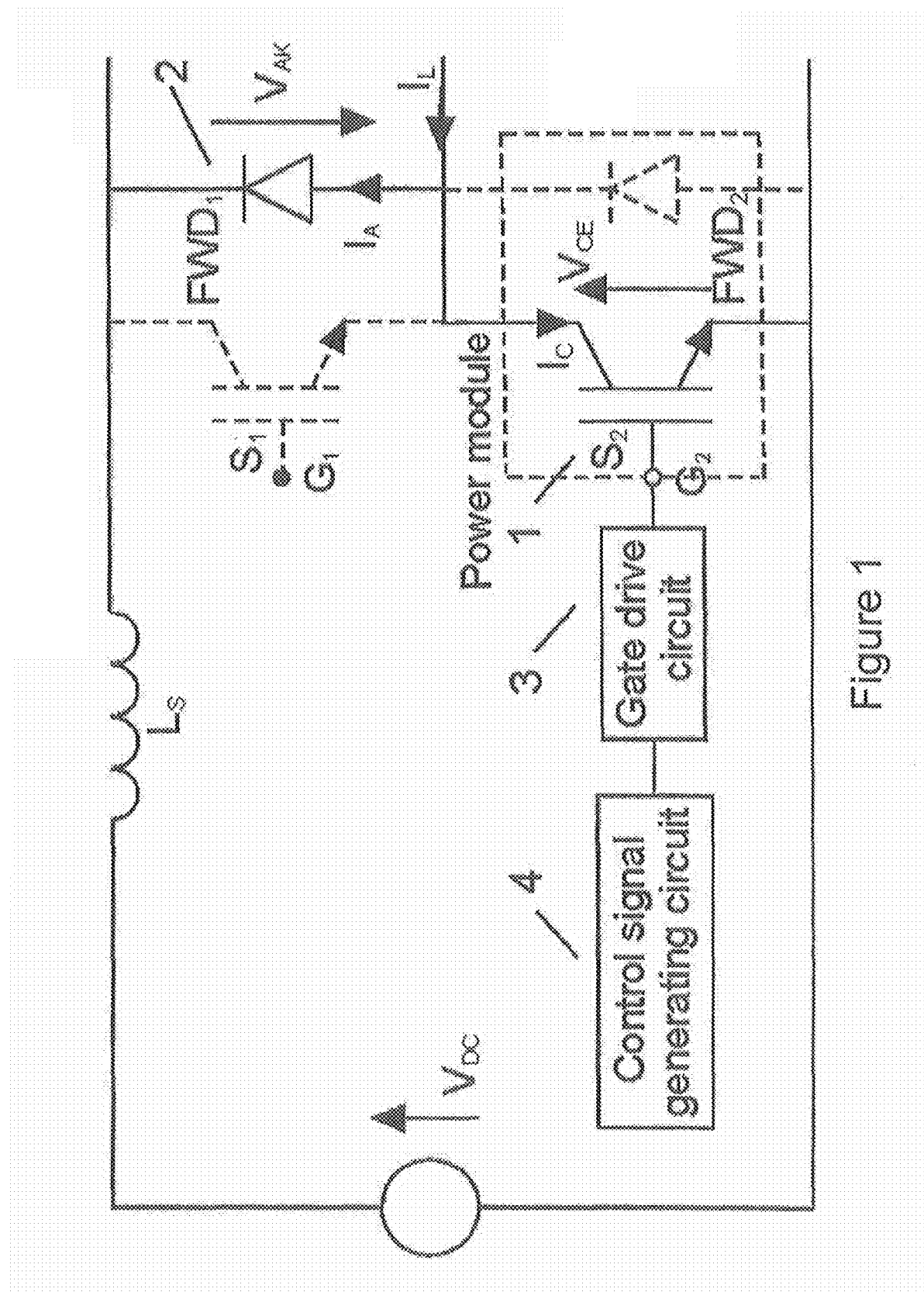
FIG. 1 is a diagram showing an embodiment of a circuit according to the present invention employed in a half-bridge arm of an inverter.

FIG. 1 shows the circuitry of an embodiment of the present invention applied in a half-bridge circuit, wherein two pairs of power semiconductor switching devices ($S_1$, $S_2$) and freewheel diodes ($FWD_1$, $FWD_2$) are connected as shown in the figure. The half-bridge configuration is the basic topology upon which most inverters are based. As shown in FIG. 1, a freewheel diode is placed in anti-parallel with each power semiconductor switching device. This arrangement normally constitutes a power module. When the upper switching device $S_1$ is on, the lower device $S_2$ is off, and vice-versa. The diodes $FWD_1$ and $FWD_2$ are to provide a path for the inductive load current $I_L$. The current interaction between $S_2$ 1 and $FWD_1$ 2 is also shown. When the load current $I_L$ is flowing in the direction as specified in FIG. 1, the current is commutated from $FWD_1$ 2 to $S_2$ 1 during a switch-on operation of $S_2$ 1. A gate drive circuit 3, connected to the gate terminal $G_2$ for controlling $S_2$ 1, is effectively a buffer circuit for a control signal generating circuit 4. The DC loop stray inductance $L_S$, shown in FIG. 1, will also influence the switching, as a current change in $L_S$ will induce a voltage across it.

Figure 2:
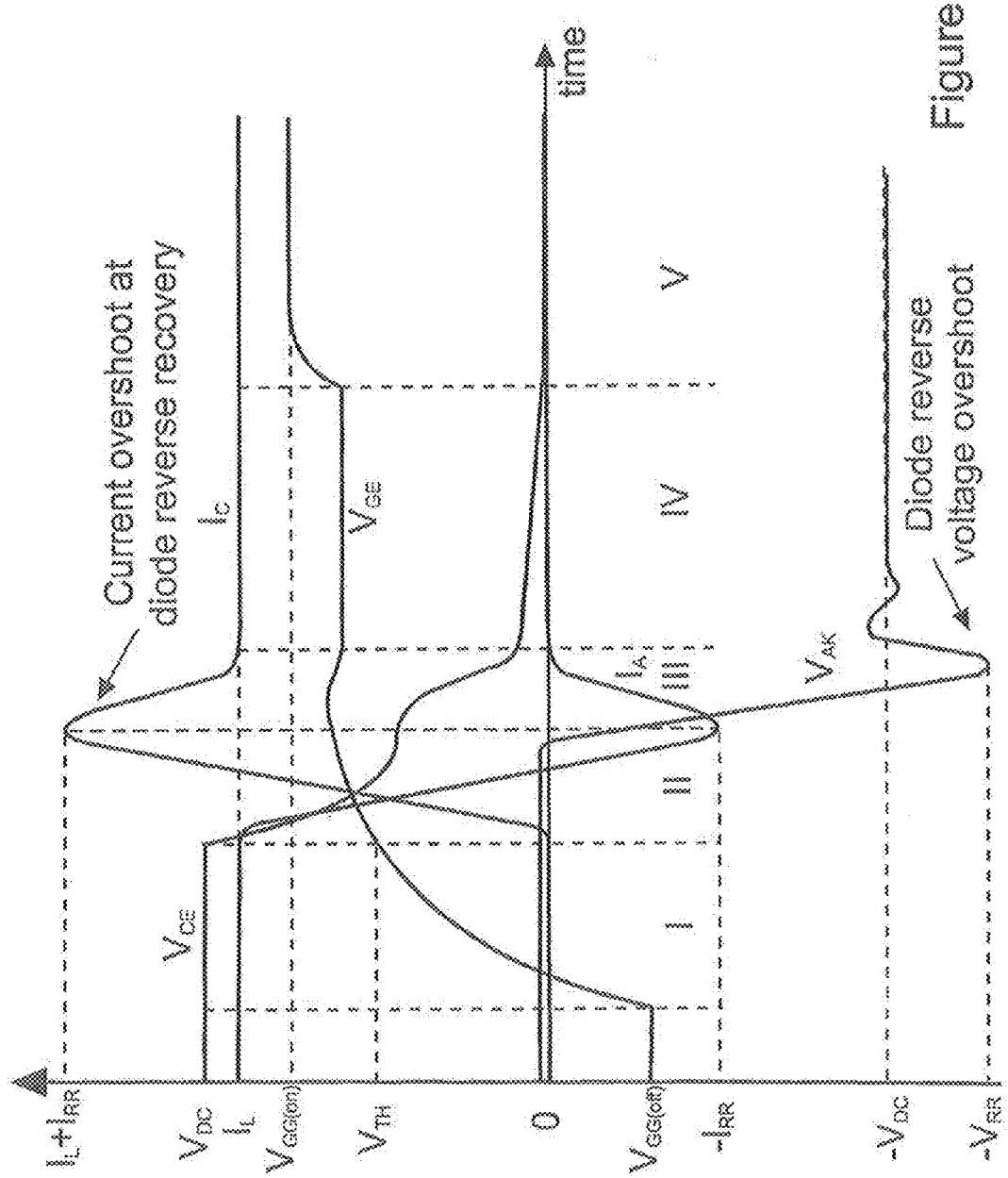
FIG. 2 shows typical switching waveforms during a hard switch-on operation of an IGBT.

FIG. 2 shows a typical example of the current commutation process between an IGBT in position $S_2$ 1 and its corresponding freewheel diode $FWD_1$ 2 during a hard switching. Although the following description is primarily with respect to IGBTs, it is noteworthy that the circuit also suits other MOS-gated devices such as power MOSFETs. As shown in FIG. 2, the voltage and current waveforms associated with the IGBT 1 and the freewheel diode 2 are usually depicted in five phases. During phase I, the IGBT gate-emitter voltage $V_{GE}$ rises towards the gate threshold voltage $V_{TH}$, whilst the IGBT 1 is still off. As the IGBT collector current $I_C$ begins to rise at the start of phase II, the IGBT collector-emitter voltage $V_{CE}$ starts to fall at the same time, because the rate of current change $dI_C/dt$ induces a voltage across the inductance $L_S$. Since the load current $I_L$ is practically constant, when $I_C$ rises rapidly from zero to the level $I_L$, the diode current $I_A$ decreases from its forward current, equal to $I_L$, at an identical rate to zero. The excess carrier stored in the diode drift region is removed before the junction can become reverse biased. Thus $I_A$ falls below zero to draw reverse recovery current and $I_C$ increases above the level $I_L$, reaching the peak $I_L + I_{RR}$ at the end of phase II, by which point the diode 2 has begun to regain reverse blocking capability. During phase III, the growing reverse voltage across the diode 2 causes $V_{CE}$ to decrease rapidly. With $V_{CE}$ approaching zero and $I_C$ reducing, an overshoot $V_{RR}$ usually appears in $V_{AK}$. The relationship between $V_{AK}$, $V_{CE}$ and $I_C$ is revealed in the following equation:

$$V_{CE} - V_{AK} + L_S \times \frac{dI_C}{dt} = V_{DC} \quad (1)$$

The $dI_C/dt$ occurring during the reduction in $I_C$ to the load current level $I_L$ in the absence of concurrent control over $V_{CE}$ and $V_{AK}$ makes the diode voltage reverse overshoot $V_{RR}$ very likely. $V_{CE}$ completes its drop to the on-state voltage level in phase IV and phase V follows with the growth of $V_{GE}$ to $V_{GG(on)}$.

Figure 3:
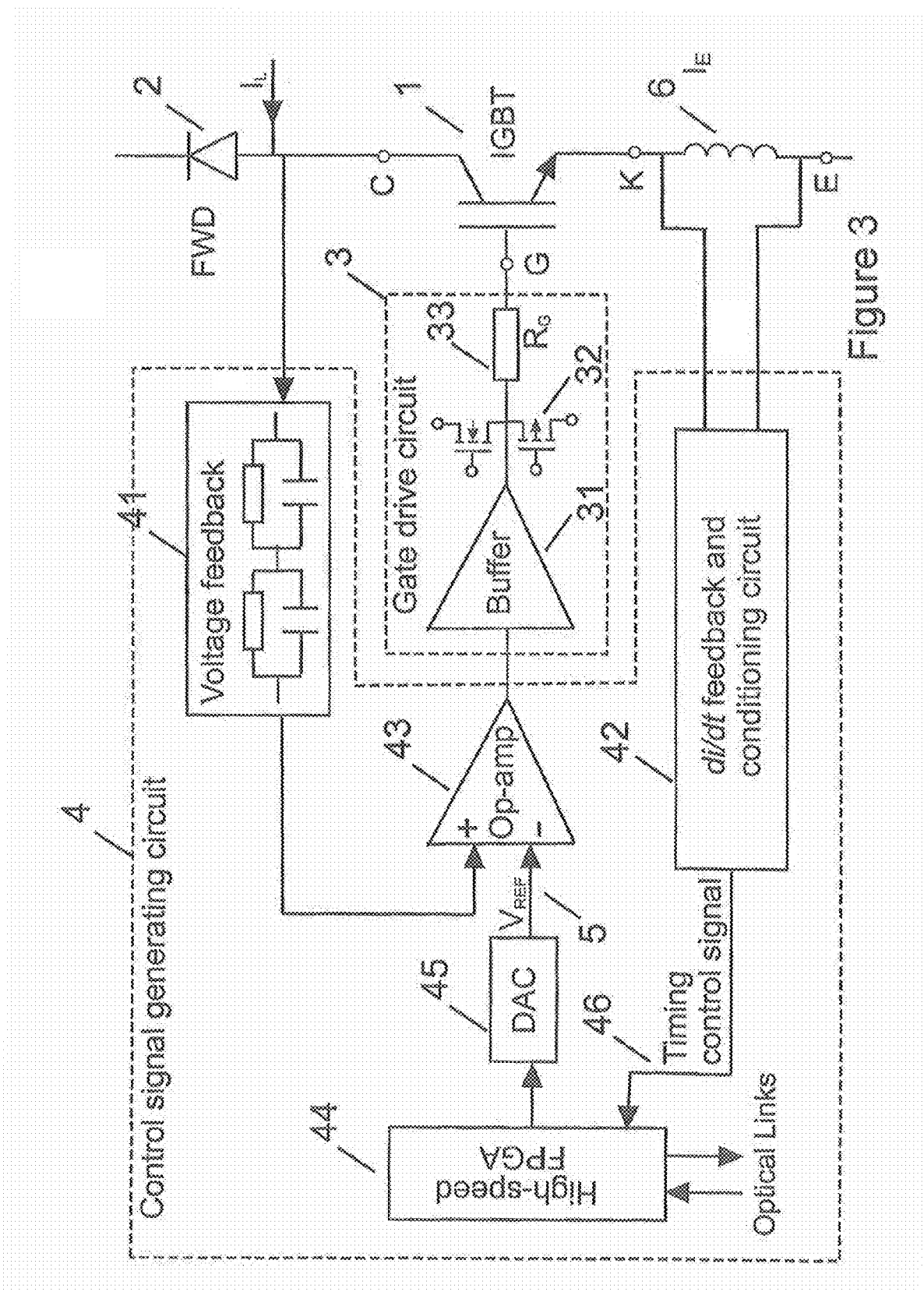
FIG. 3 is a diagram showing one specific circuit example of the present invention and of the circuitry in FIG. 1 applied on an IGBT and freewheel diode pair.

Referring to FIG. 3, a circuit diagram shows an embodiment of the present invention applied on an IGBT 1 and a freewheel diode 2. It comprises a gate drive circuit 3 and a control signal generating circuit 4.

The control signal generating circuit 4 employs two feedback loops from the device power side: the VCE voltage feedback loop 41 and the di/dt feedback and conditioning loop 42. The voltage feedback loop 41, which may be composed of an array of resistors and capacitors, is attached to the collector terminal C of the IGBT 1 and the non-inverting input of a very fast high-bandwidth operational amplifier 43. This operational amplifier 43 compares a scaled $V_{CE}$ with a reference function $V_{REF}$ 5 connected to its inverting input. The reference function 5 is generated by a high-speed FPGA (field programmable gate array) digital controller 44 and a DAC (digital to analogue converter) 45 in a specific manner described below, although alternative circuitry or microprocessor to perform the same function is possible. In this embodiment a self-timing method is proposed and realized via the di/dt feedback and conditioning circuit 42, which comprises a measuring means to detect said instant that is used to produce two distinctive stages according to the method and the circuit. The emitter Kelvin inductance $L_E$ 6, between the IGBT Kelvin terminal K and the emitter terminal E, may be used to fullfil this purpose. A timing control signal 46 is generated in the di/dt feedback and conditioning circuit 42 and fed back to the FPGA 44, which accordingly produces changes on the reference profile $V_{REF}$ 5. The FPGA 44 is connected through optical links or alternative means to other controllers (not shown) that can provide general on/off command signals.

Figure 4:
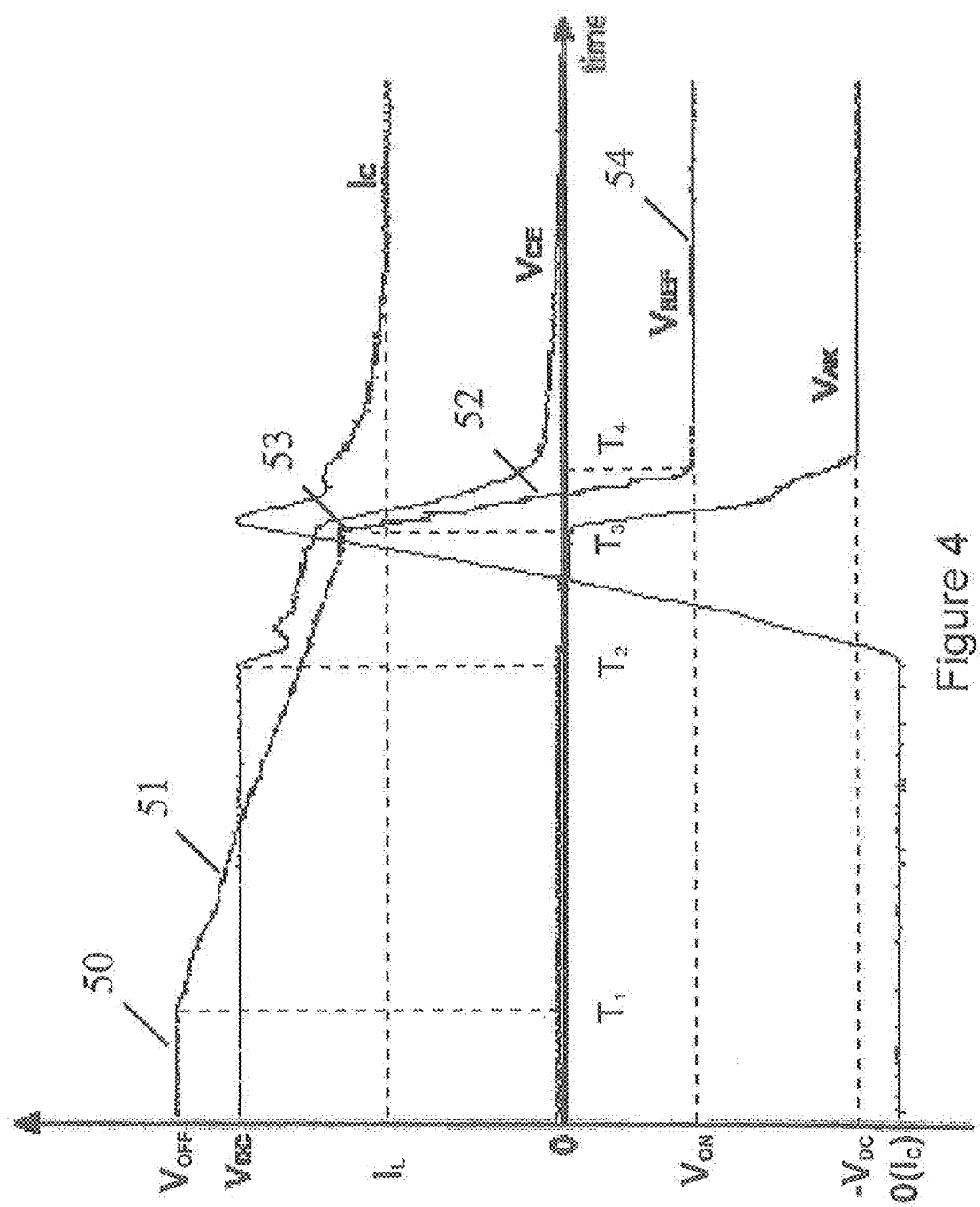
FIG. 4 shows the voltage function generated by the circuitry of FIG. 1 or 3 along with resulting switching waveforms when the method according to an embodiment of the present invention is employed.

According to an embodiment of the present invention, the two-stage voltage function is provided by the control signal generating circuit 4 to the IGBT gate terminal via the gate drive circuit 3. Referring to FIG. 4, in this particular embodiment the reference function $V_{REF}$ 5 is characterized by an initial slowly-decreasing ramp 51 followed by a steeper ramp 52 and is in essence the two-stage voltage function used according to the method. The turning point 53 needs to coincide with said instant when the diode voltage starts to change from the on-state towards the off-state level. As observed in FIG. 2, when the IGBT current reaches its peak, the diode voltage has just begun to go negative. Furthermore, the current peak point actually happens when dIc/dt changes from positive to negative, inducing a voltage polarity change across the emitter Kelvin inductance 6. Consequently, the self-timing method is proposed in this embodiment to detect the current rate change instead of diode voltage change. The timing requirement is fulfilled by the di/dt feedback and conditioning circuit 42, wherein a fast comparator may be used to monitor dIc/dt and detect the instant when the voltage across the Kelvin inductance 6 changes the polarity. At this instant, the di/dt feedback and conditioning circuit 42 generates a timing control signal 46 to instruct the FPGA 44 to terminate the first slow ramp 51 and to switch the reference function 5 to the second steeper ramp 52. This process features a self-timing control and therefore is a so-called self-timing method. Again alternative methods or ways may be employed to perform embodiments of a method according to the invention.

Under the regulation of the two-stage voltage function $V_{REF}$ 5 according to an embodiment of the present invention, the switching waveforms are optimized as shown in FIG. 4. At a time zero, the IGBT 1 is off and blocks a voltage equal to $V_{DC}$, whilst the diode 2 is on with full current flow and a very low on-state voltage across it. At time $T_1$, the reference function 5 starts from a certain positive level $V_{OFF}$ 50 to a relatively slow ramp 51. From time $T_2$, the IGBT current $I_C$ rises from zero and the collector-emitter voltage $V_{CE}$ falls to track the reference ramp 51 according to a certain feedback ratio. At time $T_3$, when $V_{AK}$ starts to change towards the off-state level, the second steeper ramp 52 is initiated and $V_{CE}$ is directed to follow the diode voltage fall and to rapidly complete switch-on operation. After $V_{AK}$ reaches $-V_{DC}$ at time $T_4$, the ramp 52 is terminated and the reference 5 is maintained at a negative voltage level $V_{ON}$ 54 until a switch-off command is given. From time $T_1$ to $T_3$, an initial relatively slow ramp 51 circumscribes the decreasing rate of $V_{CE}$ and slows down the current rise of the IGBT 1, which results in lower current overshoots of both the IGBT 1 and the diode 2. The main fall of the IGBT voltage $V_{CE}$ is delayed until the diode 2 recovers and its voltage is ready to fall. Such tracking reduces the voltage seen by the combination of the stray inductance Ls and the diode junction capacitance. As a good synchronization between the reference turning point 53 and the instant of the diode voltage fall is maintained by the tracking control, the decrease of $V_{AK}$ is a smooth reduction, which completely avoids diode reverse voltage overshoot. A slight inflection in the middle of the diode voltage drop emerges, marking a change of the voltage decreasing rate. This can be explained according to Equation 1. While $V_{CE}$, $V_{AK}$ and $I_C$ are falling, $V_{AK}$ decreases at a faster rate than $V_{CE}$ because of the changing voltage created across Ls. When $V_{CE}$ has dropped to a low value, $I_C$ enters a smooth decay period.

Figure 5:
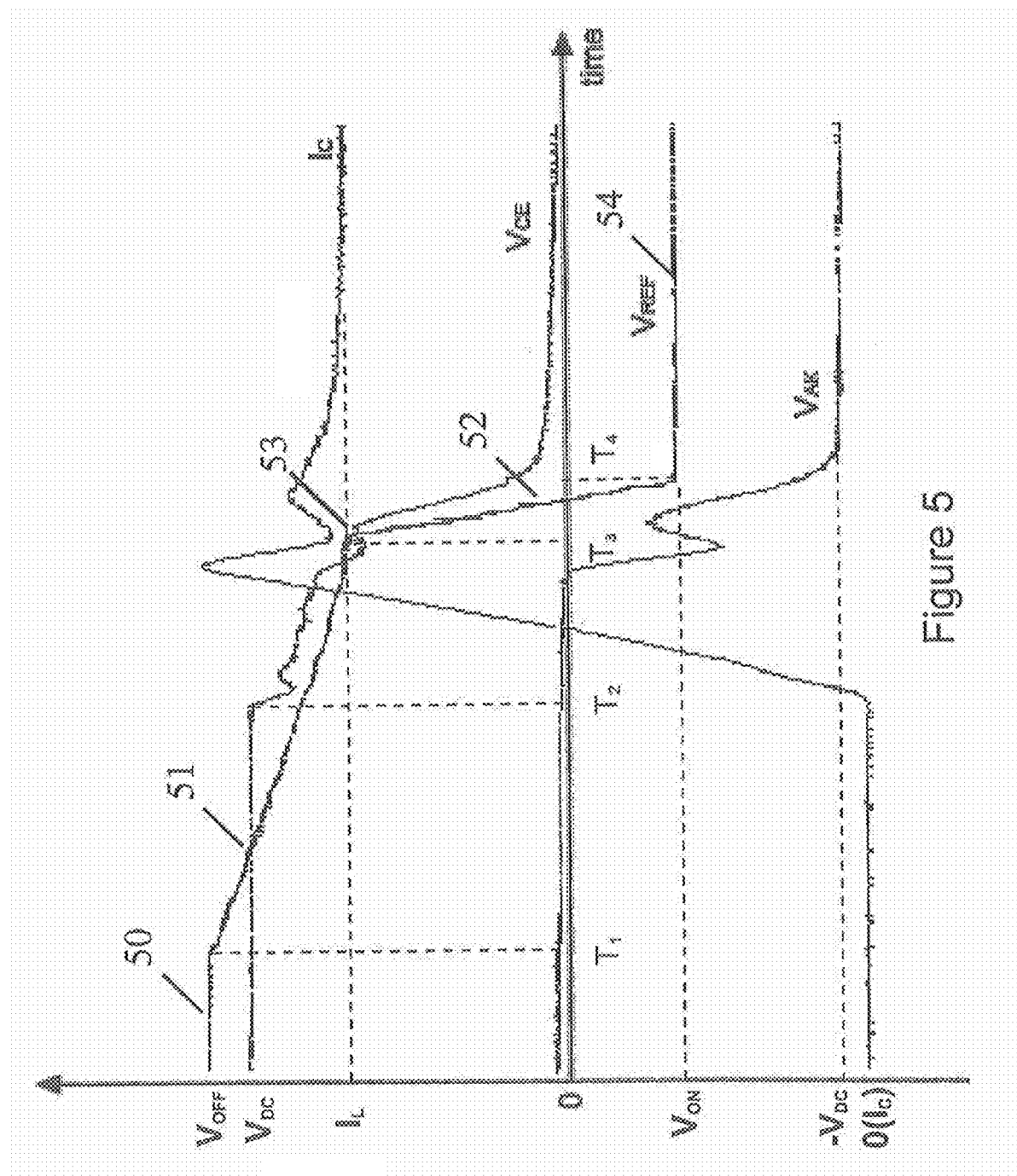
FIGS. 5 and 6 show the switching waveforms without the good timing control which can be provided by embodiments of the present invention.
Figure 6:
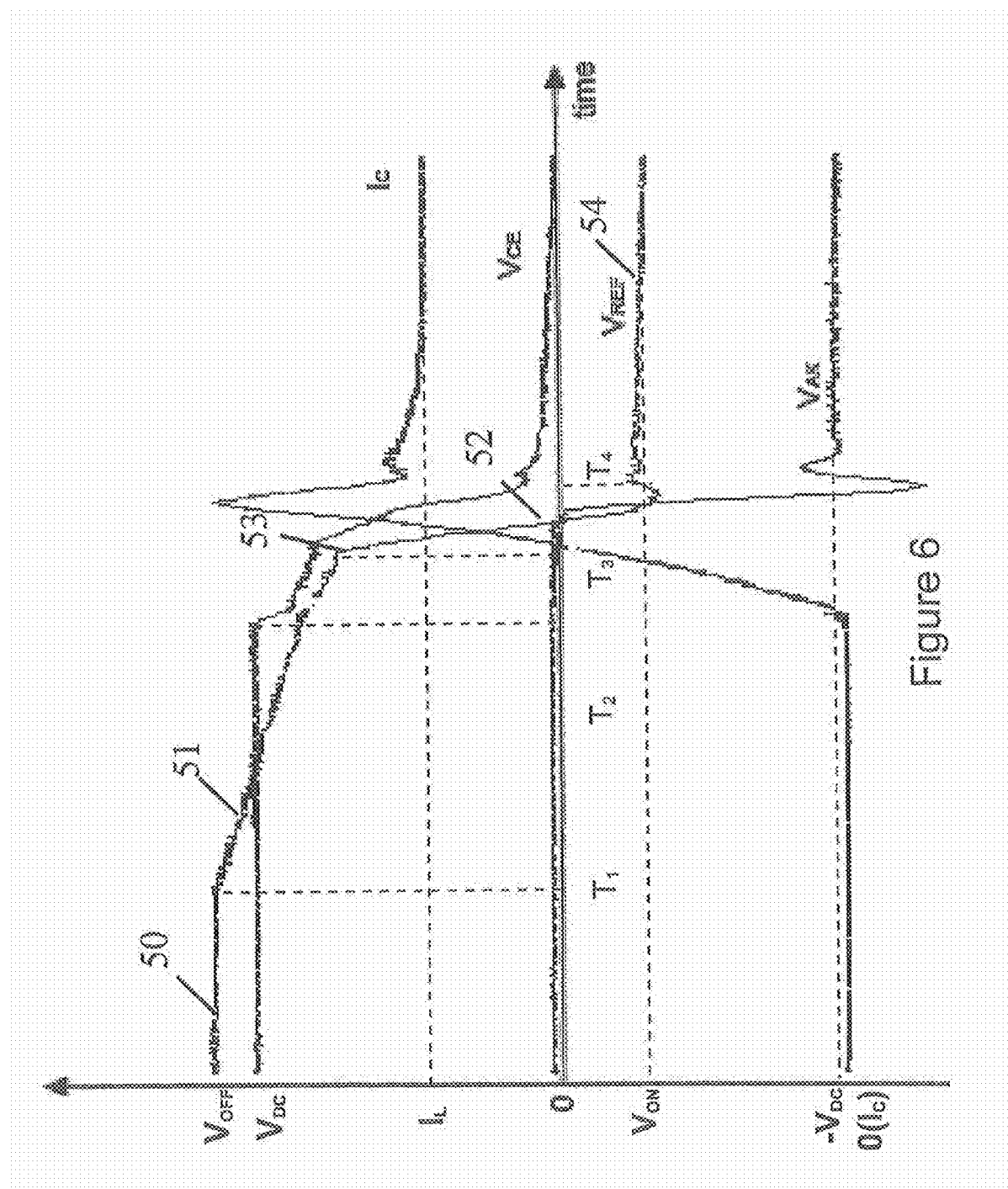

Preferably (but not essentially) good timing between the instant when the diode voltage begins to change towards the off-state level and the reference function turning point 53 is used in the method to obtain an optimal performance. By comparison, two scenarios without good timing control in this embodiment are shown in FIG. 5 and FIG. 6. When the synchronization between the reference turning point 53 and the desired instant cannot be realized, the optimal switching performance, as shown in FIG. 4, will be lost. In FIG. 5, when the $V_{REF}$ turning point 53 is lagging behind the start of the diode voltage change, there is a high current overshoot and the diode reverse voltage overshoot occurs too early, marking a kink in the middle of the diode voltage. Although the diode voltage does not overshoot beyond $-V_{DC}$, both the current overshoot stress and switching power losses are increased. When the turning point 53 is leading the desired instant as shown in FIG. 6, the overshoot in the diode voltage $V_{AK}$ reappears accompanied by a very high IGBT current overshoot. The overall power losses may be slightly reduced compared to that under the good timing control; however, the rating margins in both current and voltage are largely reduced.

By use of embodiments of the present invention, controlled switching of both the IGBT 1 and the freewheel diode 2 substantially removes commonly seen diode reverse voltage overshoot and effectively reduces the current overshoots of both devices. The power dissipation during the switching process is optimised. This control process is a real-time self-optimisation independent of the operating conditions. As the self-timing control stands, the reference function 5 changes according to the real working conditions. Furthermore, both $dV_{CE}/dt$ and $dI_C/dt$ of the IGBT can be regulated through changing the ramp rate of the reference function 5. Close tracking between the IGBT voltage and the reference function 5 also allows devices in a series string to commence switch-on simultaneously when connected in series.

The real-time optimisation concept and the circuit configuration also hold for the switch-off operation of a power semiconductor switching device. By monitoring the power states and changing the reference function accordingly, a well-controlled switch-off operation can also be realised.

The power semiconductor switching device may be an IGBT, MOSFET, or a combination of such devices. The diode may be a standard recovery diode, a fast recovery diode, and a wide range of other types can also be used as freewheel diodes.

It will be understood that the invention is not limited to the described embodiments and modifications can be made within the spirit and scope of the claims appended hereto.

The invention claimed is:

1. A method of controlling the commutation of a power semiconductor switching device and freewheel diode pair, the method comprising:
    applying, upon receipt of a switch-on command signal, a first waveform portion of a voltage function to a control terminal or the gate of the power semiconductor switching device, said first waveform portion of said voltage function allowing regulation of a current rise in the device whilst changing voltage across the device; and
    detecting a feature in a current or voltage sense signal of said pair, said feature substantially at the instant when the voltage across the diode begins to change from an on-state towards an off-state voltage during said applied first waveform portion of said voltage function;
    generating a reference function and producing a change in profile of said reference function responsive to said detection to thereby change said voltage function from said first waveform portion to a second waveform portion;
    applying substantially at said instant said second waveform portion of said voltage function to the control terminal or the gate of the power semiconductor switching device to enable the voltage change across the power semiconductor switching device to substantially track the voltage change across the diode; and
    controlling voltage change across the power semiconductor switching device during applying said first and second waveform portions, on the basis of comparison of said reference function and a scaled voltage of said semiconductor switching device.

2. The method as claimed in claim 1 wherein said changing of said voltage across said device comprises maintaining falling of said voltage according to a predetermined rate.

3. The method according to claim 1, further comprising synchronizing a start of a reverse voltage appearing across the freewheel diode with:
    the start of an increase of rate of change of voltage fall of the power semiconductor switching device when said diode begins switching, and
    a current peak in the power semiconductor switching device, said synchronizing such that current commutation substantially without diode-reverse overshoot is achieved.

4. A method according to claim 1, wherein said voltage function is determined by the use of closed-loop feedback monitoring.

5. A method according to claim 1, further comprising altering said voltage function to alter said commutation process.

6. The method according to claim 2, further comprising synchronizing a start of a reverse voltage appearing across the freewheel diode with the start of an increase of rate of change of voltage fall of the power semiconductor switching device when said diode begins switching and a current peak in the power semiconductor switching device, such that current commutation substantially without diode-reverse overshoot is achieved.

7. The method according to claim 6, wherein said voltage function is determined by the use of closed-loop feedback monitoring.

8. The method according to claim 7, further comprising altering said voltage function to alter said commutation process.

9. The method according to claim 3, wherein said voltage function is determined by the use of closed-loop feedback monitoring and, further comprising altering said voltage function to alter said commutation process.

10. A circuit for commutation of a power semiconductor switching device and freewheel diode pair the circuit comprising:
    a gate drive circuit for providing a gate drive voltage for the power semiconductor switching device; and
    a control signal generating circuit, connected to the gate drive circuit, wherein said control signal generating circuit is configured to:
    produce, upon receipt of a switch-on signal, a first stage control signal to control the gate drive circuit to drive the power semiconductor switching device to change voltage across said device;
        detect a feature in a current or voltage sense signal of said pair, said feature substantially at an instant when voltage across the diode begins to change from an on state towards an off-state voltage during said produced first stage of said control signal; and
        generate a reference function and produce a change in profile of said reference function responsive to said detection to thereby change said control signal from said first stage to said second stage of said control signal synchronized with the start of said voltage across said diode falling, to control the gate drive circuit to drive the voltage across the power semiconductor switching device to change substantially in synchronism with the diode voltage, and
    a feedback loop arranged to control voltage change across the power semiconductor switching device during said first and second stages of said control signal dependent on comparison of said reference function and a scaled voltage of said semiconductor switching device.

11. The circuit according to claim 1, wherein said control signal generating circuit comprises a closed-loop voltage feedback circuit to feed back a sensed voltage from said power semiconductor switching device and freewheel diode pair to said control signal generating circuit, and a current monitoring circuit to feedback a current sense signal from said power semiconductor switching device and freewheel diode pair to said control signal generating circuit, and wherein said first and second stages of said control signal are responsive to said sensed voltage and said current sense signal.

12. The circuit according to claim 10, wherein said control signal generating circuit is to reduce reverse recovery voltage overshoot of a diode by generating the reference function.

13. A circuit for controlling the commutation of a power semiconductor switching device and freewheel diode pair, the circuit comprising:
    means for applying, upon receipt of a switch-on command signal a first waveform portion of a voltage function to a control terminal or the gate of the power semiconductor switching device, a current rise in the device whilst changing the voltage across the diode;
    means for detecting an, instant when the voltage across the diode begins to change from an on-state towards an off-state voltage during said applied first waveform portion of said voltage function;
    means for generating a reference function and producing a change in profile of said reference function responsive to said detection to thereby change said voltage function from said first waveform portion to a second waveform portion;
    means for applying substantially at said instant said second portion of said voltage function to the control terminal or the gate of the power semiconductor switching device to enable the voltage change across the power semiconductor switching device to substantially track the voltage change across the diode; and
    means for controlling voltage change across the power semiconductor switching device during applying said first and second waveform portions on the basis of said reference function.

14. A commutation control circuit for a chopper circuit, said chopper circuit including an active switching device and a passive switching device coupled in series, said commutation control circuit being configured to control commutation of said switching devices such that said switching devices switch substantially in synchronism, said control circuit comprising:
    a first sense input to receive a first sense signal from said chopper circuit;
    a second sense input to receive a second sense signal from said chopper circuit; and
    a control signal generating circuit coupled to said first and second sense inputs and having an output to control switching of said active switching device; and wherein said control signal generating circuit is configured to use said first and second sense signals to determine when said passive switch begins to switch and to control said active switching device such that said active and passive switching devices switch substantially in synchronism.

15. The commutation control circuit for a chopper circuit as claimed in claim 14, wherein said first sense signal comprises a voltage sense signal and said second sense signal comprises a current sense signal.

16. The commutation control circuit for a chopper circuit as claimed claim 14, wherein one of said sense signals comprises a current sense signal and wherein said control signal generating circuit is configured to identify a feature of said current sense signal to determine when said passive switch begins to switch.

17. The commutation control circuit for a chopper circuit as claimed 16, wherein said feature comprises reversal of a current through said passive switch.

18. The commutation control circuit for a chopper circuit as claimed in claim 14, wherein said control signal generating circuit comprises at least one digital control loop between one of said sense inputs and said control output.

19. The commutation control circuit for a chopper circuit as claimed in claim 14, wherein said active switching device comprises a MOS switching device and wherein said passive switching device comprises a rectifier.

20. The commutation control circuit for a chopper circuit as claimed in claim 14, wherein said control signal generating circuit is configured to reduce reverse recovery voltage overshoot of the passive switching device.

* * * * *